US011152186B2

(12) United States Patent
Yamane et al.

(10) Patent No.: US 11,152,186 B2
(45) Date of Patent: Oct. 19, 2021

(54) CHARGED PARTICLE BEAM DEVICE

(71) Applicant: Hitachi High-Technologies Corporation, Tokyo (JP)

(72) Inventors: Wataru Yamane, Tokyo (JP); Minoru Yamazaki, Tokyo (JP); Yuko Sasaki, Tokyo (JP); Wataru Mori, Tokyo (JP); Takashi Doi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/354,670

(22) Filed: Mar. 15, 2019

(65) Prior Publication Data

US 2019/0311875 A1 Oct. 10, 2019

(30) Foreign Application Priority Data

Apr. 6, 2018 (JP) ............................ JP2018-073548

(51) Int. Cl.

| | |
|---|---|
| ***H01J 37/147*** | (2006.01) |
| ***H01J 37/244*** | (2006.01) |
| ***H01J 37/22*** | (2006.01) |
| ***H01J 37/10*** | (2006.01) |
| ***H01J 37/28*** | (2006.01) |

(52) U.S. Cl.

CPC .......... *H01J 37/1478* (2013.01); *H01J 37/10* (2013.01); *H01J 37/222* (2013.01); *H01J 37/244* (2013.01); *H01J 37/28* (2013.01); *H01J 2237/2448* (2013.01); *H01J 2237/2817* (2013.01)

(58) Field of Classification Search

CPC .. H01J 37/21; H01J 37/28; H01J 37/10; H01J 37/222; H01J 2237/2817; H01J 2237/30433; H01J 37/1478; H01J 37/244; H01J 2237/2448; H01J 2237/0492

See application file for complete search history.

(56) References Cited

U.S. PATENT DOCUMENTS

| | | | | |
|---|---|---|---|---|
| 9,941,095 | B2 * | 4/2018 | Watanabe ............... | H01J 37/28 |
| 2006/0226362 | A1 * | 10/2006 | Kitsuki ................ | H01J 37/263 250/310 |
| 2011/0278453 | A1 * | 11/2011 | Oosaki .................... | H01J 37/28 250/310 |

(Continued)

FOREIGN PATENT DOCUMENTS

| | | |
|---|---|---|
| JP | 2013-214402 A | 10/2013 |

*Primary Examiner* — Wyatt A Stoffa

(74) *Attorney, Agent, or Firm* — Crowell & Moring LLP

(57) ABSTRACT

An object of the present disclosure is to propose a charged particle beam device capable of appropriately evaluating and setting a beam aperture angle. As one aspect for achieving the above-described object, provided is a charged particle beam device which includes a plurality of lenses and controls the plurality of lenses so as to set a focus at a predetermined height of a sample and to adjust the beam aperture angle. The charged particle beam device generates a first signal waveform based on a detection signal obtained by scanning with the beam in a state where the focus is set at a first height that is a bottom portion of a pattern formed on the sample, calculates a feature amount of a signal waveform on a bottom edge of the pattern based on the first signal waveform, and calculates the beam aperture angle based on the calculated feature amount.

5 Claims, 12 Drawing Sheets

32 25 30 7 33 34 31

(56) References Cited

U.S. PATENT DOCUMENTS

| | | | | |
|---|---|---|---|---|
| 2012/0305797 | A1* | 12/2012 | Preikszas | H01J 37/28 250/397 |
| 2016/0379795 | A1* | 12/2016 | Watanabe | H01J 37/21 250/310 |
| 2018/0040456 | A1* | 2/2018 | Shimizu | G03F 7/20 |
| 2018/0358199 | A1* | 12/2018 | Kumamoto | H01J 37/28 |
| 2019/0148108 | A1* | 5/2019 | Sun | H01J 37/28 250/307 |

* cited by examiner

[FIG. 1]
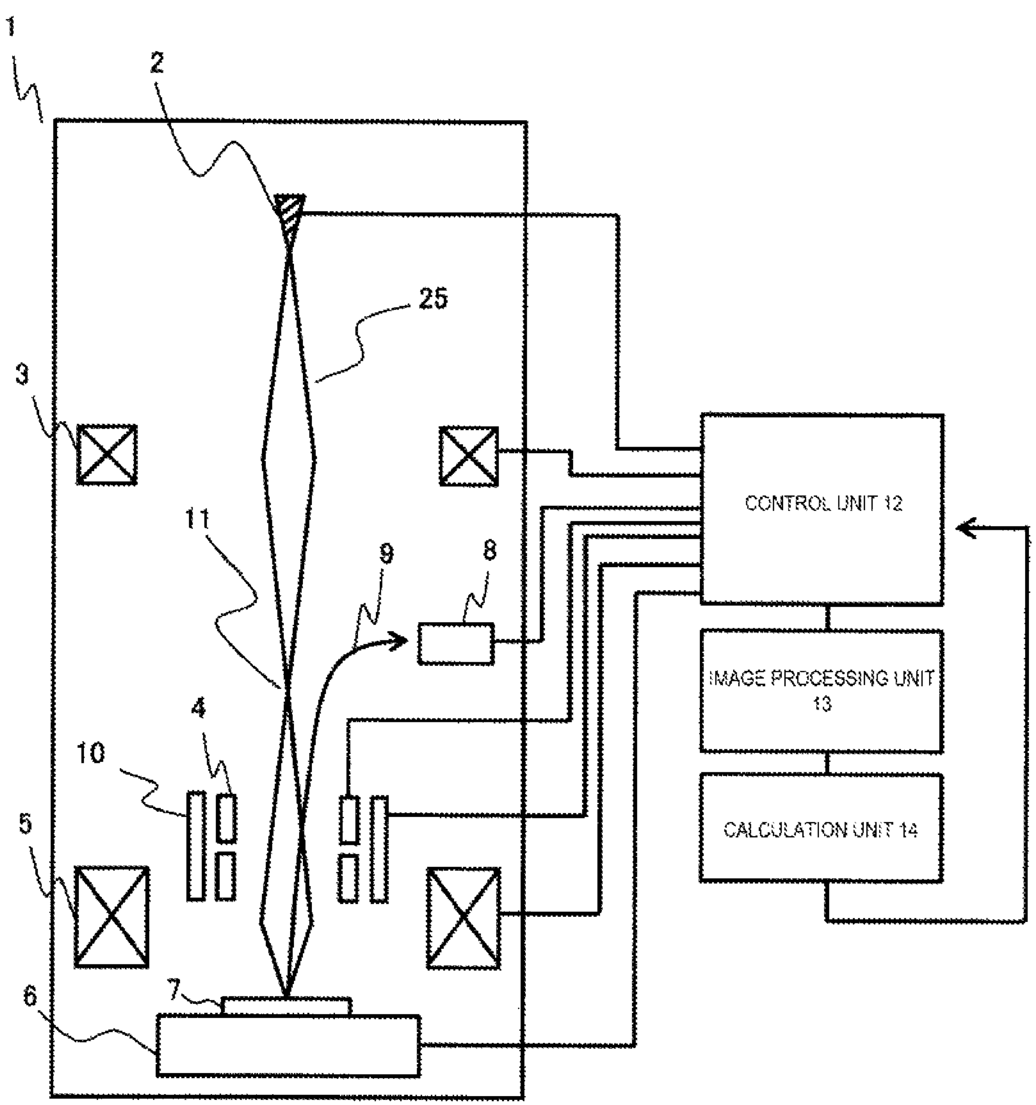

[FIG. 2]
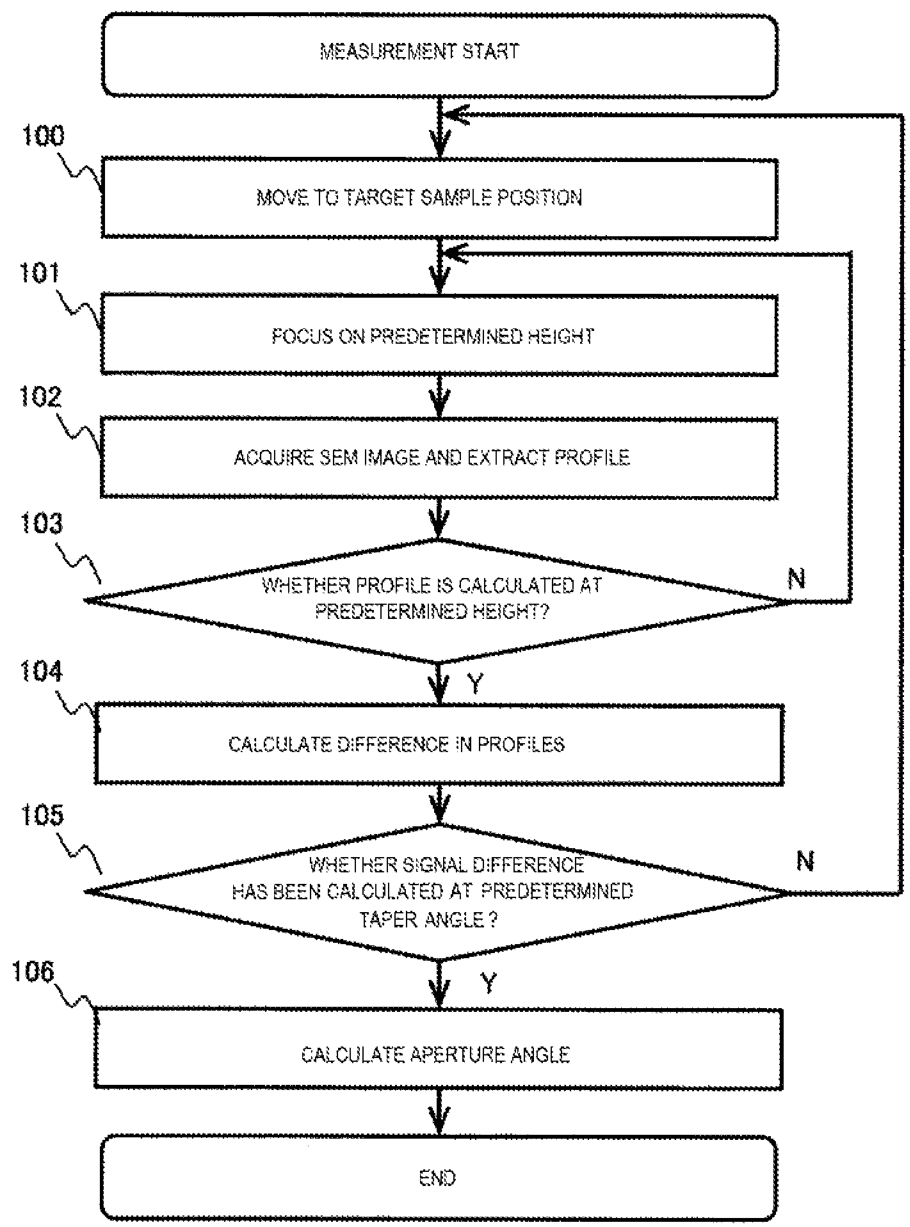

[FIG. 5]
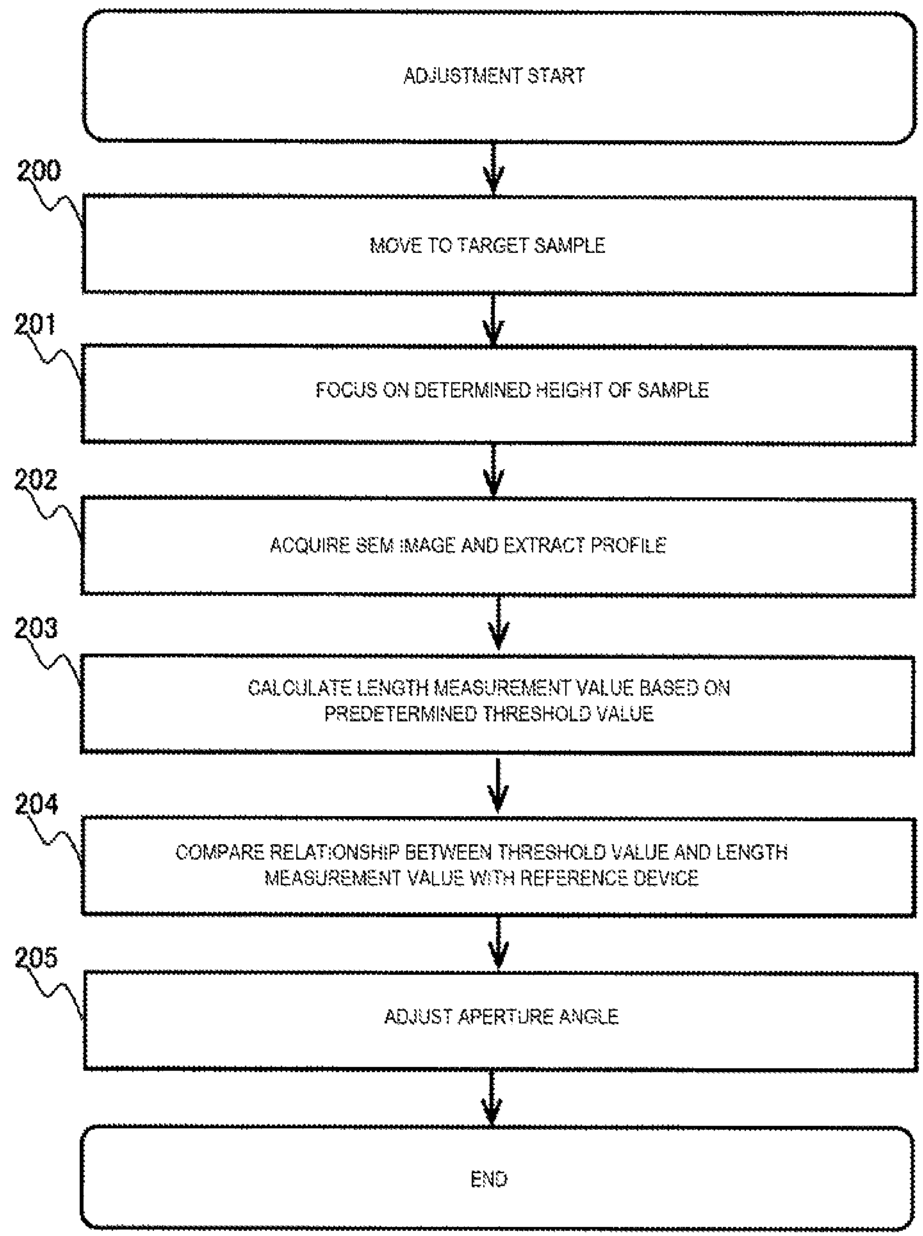

[FIG. 7]
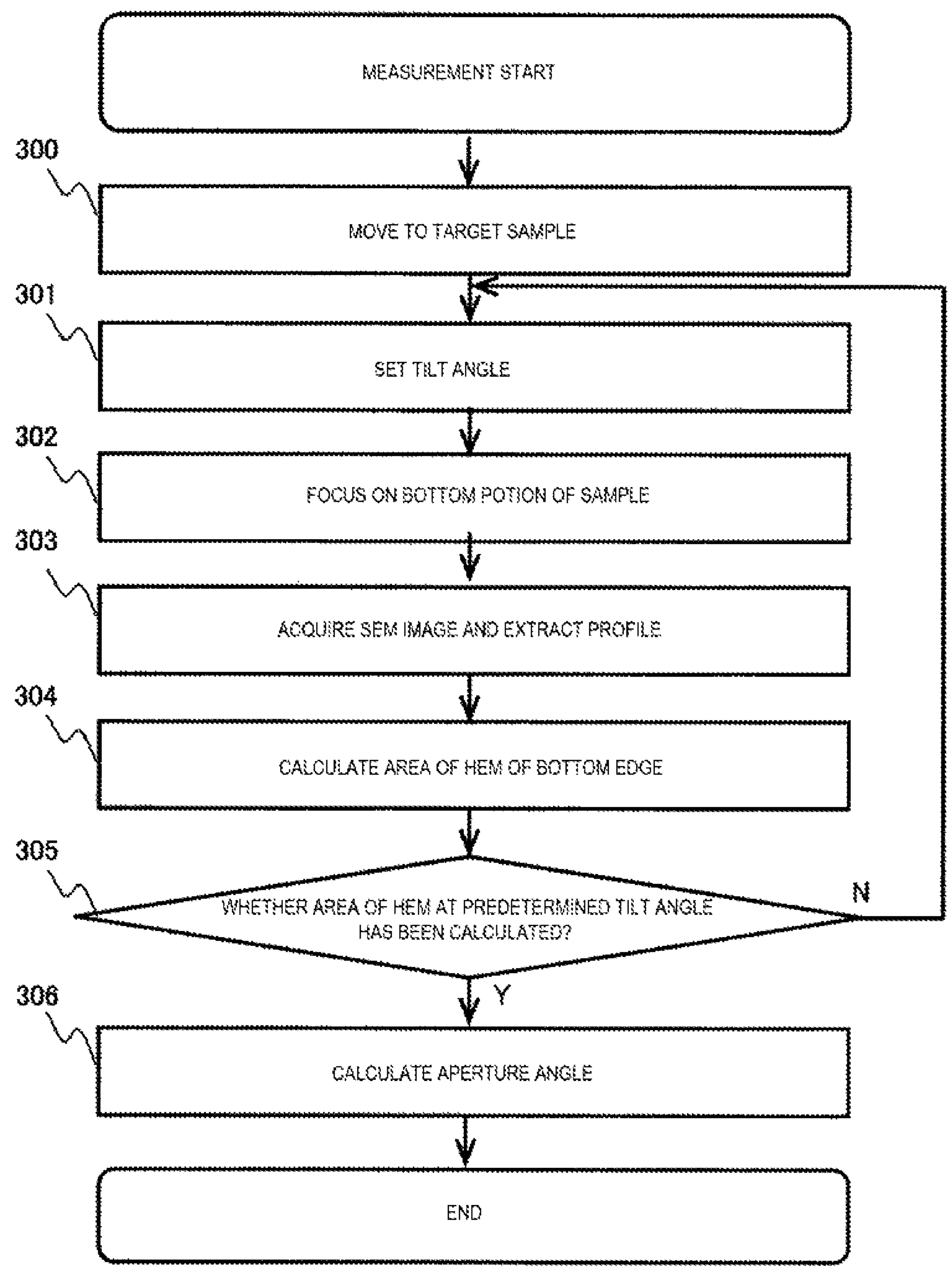

[FIG. 10]
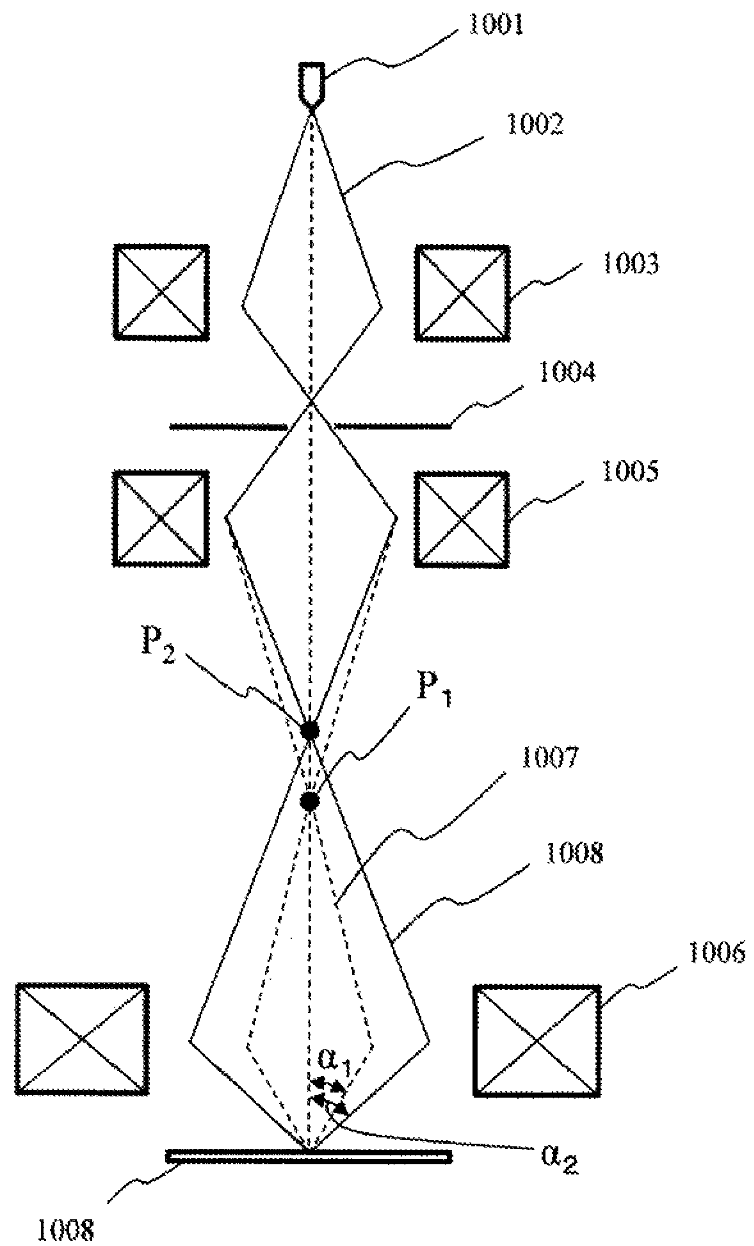

[FIG. 11]
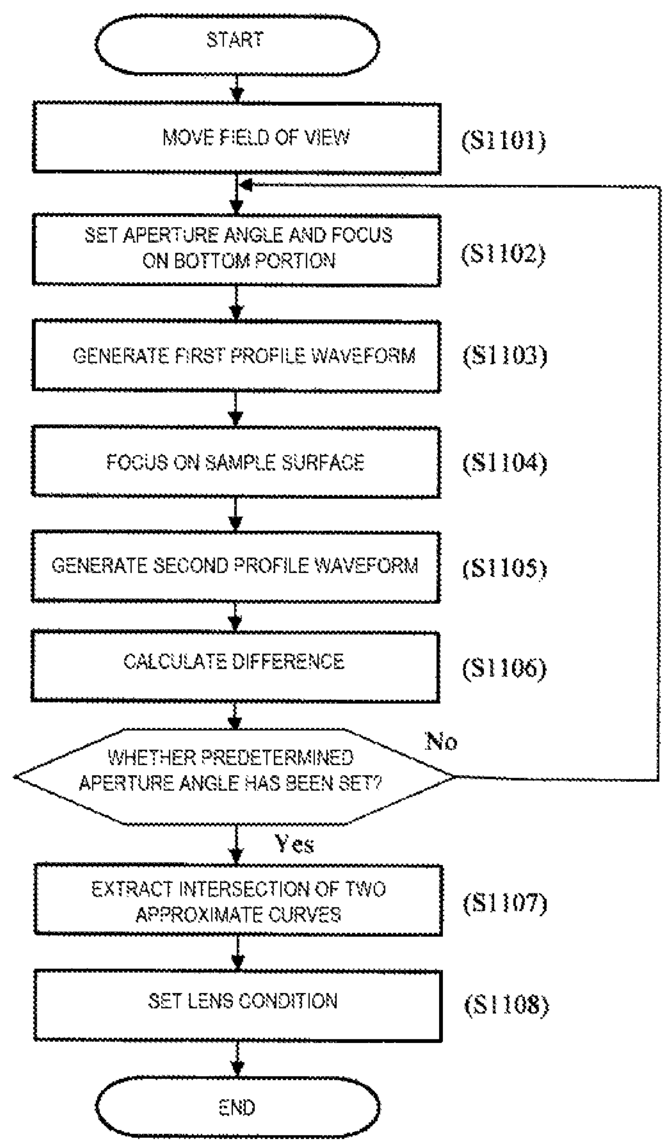

[FIG. 12]
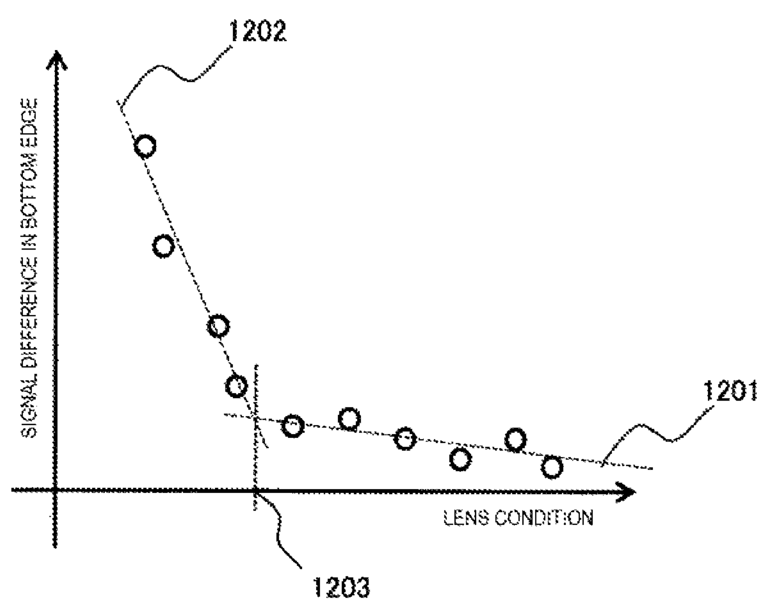

CHARGED PARTICLE BEAM DEVICE

TECHNICAL FIELD

The present disclosure relates to a charged particle beam device, and particularly to a charged particle beam device capable of actually measuring a beam aperture angle.

BACKGROUND ART

A charged particle beam device such as a scanning electron microscope irradiates a sample with a finely focused beam. At this time, since a beam aperture angle influences resolution of images of the scanning electron microscope (SEM), it is desirable to set the beam aperture angle appropriately. Patent Literature 1 discloses an electron beam device that adjusts a lens condition so as to obtain an appropriate aperture angle.

PRIOR ART LITERATURE

Patent Literature

PTL 1: JP-A-2013-214402

SUMMARY OF INVENTION

Technical Problem

Although Patent Literature 1 discloses that the position of an intermediate lens is adjusted so as to make a total lens magnification obtained when a beam current is largest substantially coincide with an ideal lens magnification specified by electron optical characteristics, it is desirable to confirm whether the beam aperture angle is appropriately set at the time of actual measurement or the like.

A charged particle beam device aiming at appropriately evaluating and setting a beam aperture angle is provided below.

Solution to Problem

As one aspect for achieving the above-described object, provided is a charged particle beam device including a plurality of lenses, a control device configured to control the plurality of lenses so as to set a focus at a predetermined height of a sample and adjust a beam aperture angle, a detector configured to detect a particle generated by irradiating the sample with a charged particle beam, and a processor configured to process an output signal of the detector, wherein the processor generates a first signal waveform based on a detection signal obtained by scanning with the beam in a state where the focus is set at a first height that is a bottom portion of a pattern formed on the sample, calculates a feature amount of the signal waveform on a bottom edge of the pattern based on the first signal waveform, calculates the beam aperture angle based on the calculated feature amount of the signal waveform on the bottom edge, and sets at least one condition for the plurality of lenses.

Further, as another aspect for achieving the above-described object, provided is a charged particle beam device including a plurality of lenses, a control device configured to control the plurality of lenses so as to set a focus at a predetermined height of a sample and adjust a beam aperture angle, a detector configured to detect particles generated by irradiating the sample with a charged particle beam, and a processor configured to process an output signal of the detector, wherein the processor generates a signal waveform based on a detection signal obtained by beam scanning a pattern formed on the sample, sets a plurality of threshold values for the signal waveform, measures a plurality of feature amounts related to the pattern based on the setting, and obtains an inclination indicating a change in the plurality of feature amounts, and the control device adjusts conditions of the plurality of lenses so as to make the inclination become a predetermined inclination.

Advantageous Effect

According to the above configuration, it is possible to appropriately evaluate or set a beam aperture angle.

BRIEF DESCRIPTION OF DRAWINGS

FIG. 1 is a diagram showing an overview of a scanning electron microscope.

FIG. 2 is a flowchart showing steps of measuring a beam aperture angle using a profile obtained by beam scanning a pattern having a known taper angle.

FIG. 5 is a flowchart showing steps of adjusting the beam aperture angle.

FIG. 7 is a flowchart showing steps of measuring the beam aperture angle based on the feature amounts of the profile waveforms on the bottom edge obtained by beam scanning at a plurality of tilt angles.

FIG. 10 is a diagram showing an example of an optical unit including a plurality of stages of lenses capable of adjusting an aperture angle.

FIG. 11 is a flowchart showing steps of setting an aperture angle suitable for measuring a target pattern based on profile waveforms obtained by setting a plurality of aperture angles.

FIG. 12 is a graph plotting a difference calculation result of a plurality of different lens conditions (aperture angles).

DESCRIPTION OF EMBODIMENTS

Figure 3A:
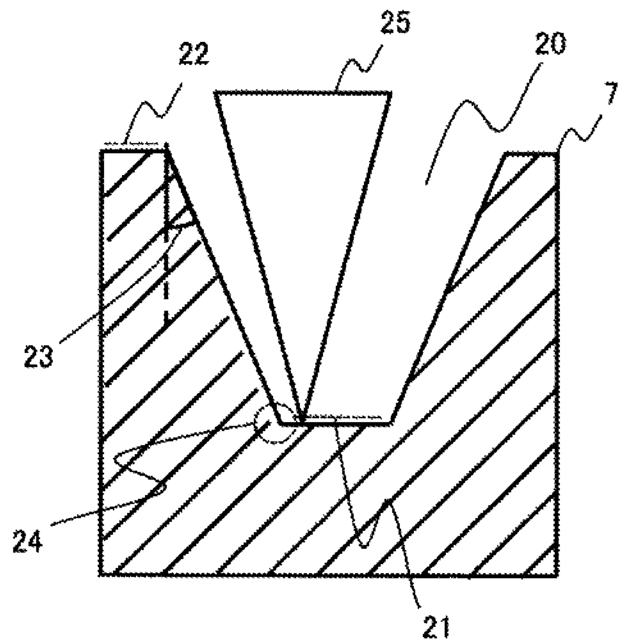
FIGS. 3A and 3B show sectional views of patterns used for aperture angle measurement.

For example, in manufacture of a semiconductor circuit which is advanced in microminiaturization, the manufacturing yield is managed by measuring a pattern dimension. In a length measuring device for semiconductors, a signal waveform is generated based on detection of electrons generated by scanning a measurement target with a focused electron beam and the dimension of a measurement position is calculated by using the signal waveform.

At this time, since a beam aperture angle greatly influences the resolution of SEM images, it is desirable to control the device so as to obtain an optimum beam aperture angle.

In particular, it is desirable to set the device condition based on an appropriate evaluation on the beam aperture angle when the device is used.

Meanwhile, the state-of-the-art semiconductor device structure of recent years has been advanced to a high aspect, and it is desirable to perform length measurement for a deep groove or deep hole structure with high accuracy. Here, a case, where a beam is focused on a bottom portion of a sample, is considered. The sample has a deep groove structure and a high aspect ratio, and is observed by an SEM. When a beam aperture angle exceeds a taper angle of the sample, a part of the beam is blocked by a three-dimensional structure of the sample and cannot reach the bottom portion of the sample. When the beam aperture angle and the taper angle are substantially equal, even if the beam aperture angle changes slightly, the amount of the beam reaching the bottom portion of the structure changes greatly, and thus the obtained length measurement value also changes greatly. Therefore, when the deep groove or the deep hole structure is observed by an SEM with high accuracy, in order to reduce the length measurement machine difference between devices, it is desirable to reduce variation in the height direction of the beam, that is, variation in the beam aperture angle.

Embodiments described below will describe a charged particle beam device that evaluates a beam aperture angle by measurement in order to quantitatively grasp an actual beam aperture angle. If the beam aperture angle can be evaluated by measurement, it is possible to reduce machine difference among a plurality of devices and perform device performance management.

Embodiments described below will describe an evaluation method for evaluating the aperture angle by using a plurality of signal waveforms obtained by beam scanning, for example, patterns having different taper angles. As an example, an image is acquired based on beam scanning a sample with a pattern having different taper angles, and a profile is generated by image analysis. A feature amount is extracted from the profile, and an aperture angle is obtained based on a relationship between the feature amount and the taper angle.

An evaluation method for evaluating the aperture angle by using a plurality of signal waveforms obtained by beam scanning at different beam tilt angles will also be described. Specifically, a plurality of images is acquired by changing the tilt angle of the beam, and a profile is generated by image analysis. Then, a feature amount is extracted from the profile, and an aperture angle is determined based on the relationship between the feature amount and the beam tilt angle.

By feeding back an obtained measurement result to a lens control unit of the device and adjusting the aperture angle, it is possible to reduce the machine difference in the aperture angles of the device.

Provided is an inspection device capable of measuring with high accuracy by measuring a beam aperture angle for each device and managing the device state so as to make variation in the aperture angle of the device within a predetermined value.

Embodiments described below will describe a charged particle beam device that evaluates a beam aperture angle by mainly using a signal obtained based on beam irradiation. According to the embodiments described below, monitoring and absolute value measurement for a beam aperture angle of a charged particle beam device such as an electron microscope can be achieved, and as a result, the machine difference of the device can be managed with high accuracy.

In the following description, a critical dimension SEM (CD-SEM) that generates a signal profile based on beam scanning and obtains a dimension value of a pattern based on the signal profile will be described as an example. However, without being limited thereto, the invention can also be applied to an electron microscope for defect inspection, an electron microscope for analysis, or a focused ion beam device that generates an image based on irradiation with a focused ion beam or the like.

FIG. 1 is a diagram showing an overview of a scanning electron microscope. The scanning electron microscope includes, in a vacuum chamber 1, a charged particle source 2, a focusing lens 3, a deflector 4, an objective lens 5, a stage 6, a detector 8, and an acceleration electrode 10. The stage 6 is configured to apply a retarding voltage Vr (a voltage that generates a deceleration electric field for the electron beam) to the sample. The deflection method of the beam may be two-stage deflection or one-stage deflection. Further, an electrostatic deflector or an electromagnetic deflector can be used as the deflector.

A beam 25 generated by an electron gun 2 is focused by the focusing lens 3 and the objective lens 5, and is accelerated by the acceleration electrode 10. The beam 25 having passed through the acceleration electrode 10 is decelerated by the deceleration electric field formed by the retarding voltage applied to the stage 6 or a sample 7, and is used to irradiate the sample 7.

A semiconductor wafer may be used as the sample 7 to be used in aperture angle measurement, adjustment, or the like, which will be described later. The sample 7 may be fixed on the stage 6 as a calibration sample.

Signal electrons 9 such as secondary electrons (SE) and backscattered electrons (BSE) emitted from a surface of the sample 7 or secondary electrons further generated by the signal electrons colliding with other members are detected by the detector 8, converted into electric signals, and converted into SEM images by an image processing unit 13.

The generated SEM images are transferred to a calculation unit 14 to calculate the beam aperture angle. Further, at the time of correcting the aperture angle, feedback is given to a control unit 12 (control device) so as to adjust the calculated aperture angle to a reference aperture angle. It should be noted that, other analysis devices after the control unit can be used without being limited to this form.

FIG. 10 is a diagram showing an example of an optical unit including a plurality of stages of lenses capable of adjusting an aperture angle. FIG. 10 shows an optical unit including three stages of lenses. An electron beam 1002 emitted from an electron source 1001 and accelerated by an acceleration electrode (not shown) is converged by a first convergent lens 1003, and an unnecessary region is removed by an aperture plate 1004. Then, the electron beam 1002 is converged by a second convergent lens 1005 and an objective lens 1006, and is used to irradiate a sample 1008. In a case of the optical unit shown in FIG. 10, an aperture angle $\alpha$ of the beam is determined by convergence conditions of the first convergent lens 1003 and the second convergent lens 1005 and a hole diameter of a hole provided in the aperture plate 1004. Focus adjustment of the beam is performed mainly by controlling the convergence condition of the objective lens 1006.

The control unit 12 appropriately controls a signal such as an excitation current to be supplied to each lens so as to have a desired aperture angle. A power supply (not shown) is incorporated in the control unit 12, and a convergence point of the second convergent lens 1005 can be set at any position on a beam optical axis. For example, image points of the second convergent lens 1005 can be set at different positions, such as $P_1$ or $P_2$. At this time, the control unit 12 controls a signal such as an excitation current to be supplied to the objective lens 1006 so as to set the focus on a sample surface or a specific height of a pattern, regardless of the change in the convergence condition of the second convergent lens 1005.

In all of the methods described herein, results of one or more steps in embodiments of the methods may be stored in a non-transitory computer-readable storage medium. The description herein is also directed to a non-transitory computer-readable medium storing program instructions executable on a computer system of wafer measurement and inspection tool for performing methods for wafer measurement and inspection. The computer system may take various forms that includes a personal computer system, an image computer, a mainframe computer system, a workstation, a network device, an internet device, or other devices, and may be defined as any device including one or more processors executing instructions from the storage medium.

Embodiment 1

Figure 3B:
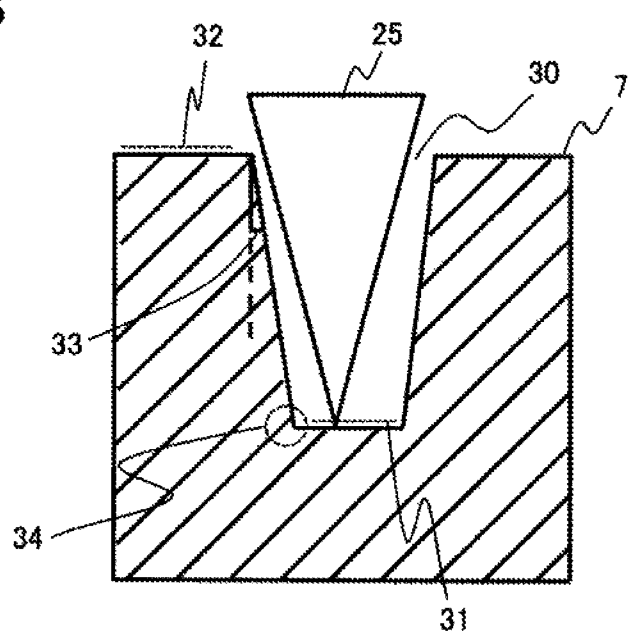

FIG. 2 is a flowchart showing steps of measuring a beam aperture angle. First, the control unit 12 moves the stage 6 with the sample 7 disposed on the stage 6, and moves the sample 7 to an irradiation position of the beam (step 100). As shown in FIG. 3(*a*), a deep groove 20 is formed in the sample 7. In the present embodiment, the deep groove 20 has a taper angle 23 with a known angle degree. A pattern having a known taper angle (sidewall angle) may be a pattern etched with a deep hole or a stepped shape without being limited to the deep groove. Here, an example adopting a sample having a plurality of patterns formed thereon is described. Each of the plurality of patterns has a known taper angle different from others, and the taper angle is used to evaluate the beam aperture angle as described below. Such a sample may be disposed in advance on the stage 6 as a standard sample, or as necessary, may be introduced from outside to perform the taper angle evaluation.

Next, the beam 25 is focused on a bottom portion 21 of the deep groove 20 (step 101). In order to focus the beam on the bottom portion 21, for example, focus evaluation values of the bottom portion 21 are selectively evaluated and an autofocus processing is performed. When the depth of the deep groove 20 is known, a focus adjustment amount (for example, an excitation current change amount) corresponding to the known depth is stored in advance in a predetermined storage medium, the focus is set on an upper portion 22 of the sample, and then the focus may be set on the bottom portion 21 by changing the focus by the focus adjustment amount. Accordingly, a signal profile (first signal waveform) indicating a relationship between the irradiation position (coordinate) of the beam and a signal amount is generated based on a signal electron obtained in a state where the focus is set on the bottom portion 21 (step 102). The signal electron acquired at this time may be either an SE or a BSE.

Next, the beam 25 is focused at a different height of the sample (step 103). For example, the beam 25 is focused on the upper portion 22 of the sample or an intermediate position between the upper portion 22 of the sample and the bottom portion 21 of the sample. Here, an SEM image is acquired in a similar manner as step 102, and a profile (second signal waveform) of the SEM image is obtained.

Here, with respect to at least two signal profiles obtained by setting the focus at different heights, attention is paid to a waveform at a position corresponding to a boundary (bottom edge 24) between the side wall (tapered portion) and the bottom portion of the deep groove 20.

Figure 4A:
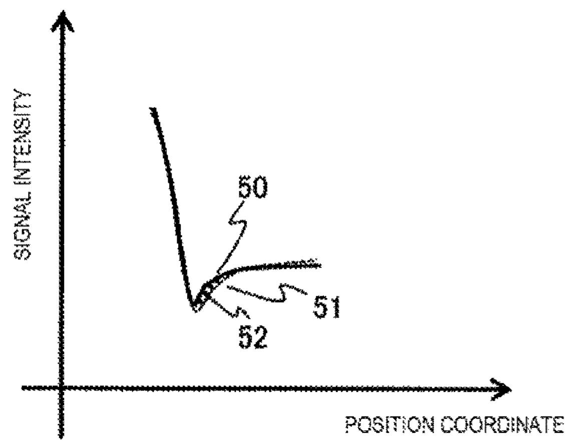
FIGS. 4A to 4C show diagrams showing profile waveforms obtained when bottom edges of patterns are scanned with a beam, and a relationship between a taper angle and a feature amount of a bottom edge waveform.
Figure 4B:
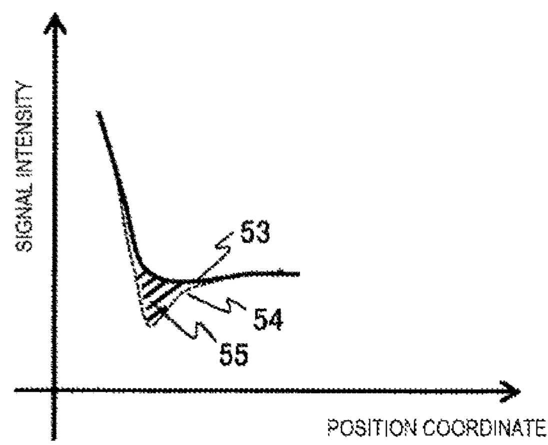
Figure 4C:
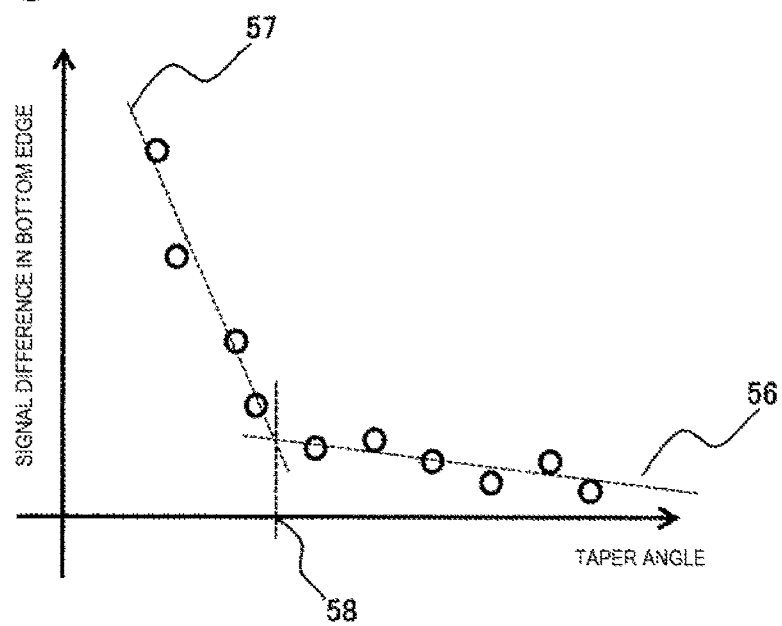

FIG. 4(*a*) is a diagram showing an example of a waveform of a portion corresponding to a bottom edge, chosen from a profile obtained by beam scanning with a certain aperture angle. In step 104, the beam aperture angle is set to a predetermined condition by, for example, adjusting the convergence conditions of the first convergent lens 1003 and the second convergent lens 1005. In this state, the objective lens 1006 is adjusted, a bottom profile 50 is acquired by performing beam scanning with the focus set on the bottom portion 21 of the deep groove 20, and a bottom profile 51 is acquired by performing beam scanning with the focus set on the upper portion 22 of the sample. In step 104, a difference (profile signal difference) between the two bottom profiles 50 and 51 is calculated. The profile signal difference corresponds to an area of a shaded portion 52 in FIG. 4(*a*).

A similar processing is performed on a pattern 30 shown in FIG. 3 (*b*) (step 105). The pattern 30 has a taper angle 33 different from that of the pattern shown in FIG. 3(*a*). The present embodiment shows an example in which the taper angle 23 is larger than the taper angle 22.

After calculating the signal difference in the profiles for a plurality of patterns having different taper angles, the beam aperture angle is calculated (step 106).

Here, since the profile of the bottom edge 24 greatly changes depending on the acceleration voltage of the beam 25 and the depth of the deep groove structure of the sample, patterns having deep groove structures with different taper angles and the same depth are used in the beam aperture angle measurement.

As shown in FIG. 3(*a*), when the beam aperture angle is smaller than the taper angle of the pattern, the beam 25 reaches the bottom edge 24 without colliding with the tapered structure of the sample even when the focus is set on the bottom portion 21. At this time, the profile 50 (solid line) shown in FIG. 4(*a*) is obtained in the vicinity of the bottom edge 24. When the beam is focused on the upper portion 22 of the sample, the profile 51 (dotted line) shown in FIG. 4(*a*) is obtained. Since the two profiles are obtained by performing beam scanning at the same position while under different focus conditions, there is no significant difference between the two profiles.

Meanwhile, as shown in FIG. 3(*b*), when the aperture angle of the beam 25 is larger than the taper angle of the pattern and a bottom edge 34 is scanned with the beam focused on a bottom portion 31 (when the bottom edge 34 is irradiated with the beam 25), a part of the beam collides with an upper portion 32 of the sample, and secondary electrons are generated due to an edge effect.

Since the generated secondary electrons are counted as signals at the time of scanning the bottom edge, signal intensity at the bottom edge is increased as shown in a profile 53 indicated by a solid line in FIG. 4(*b*).

When the beam is focused on the upper portion 32 of the sample, most parts of the beam that have crossed over the bottom edge collide with the side wall of the pattern. Since the secondary electrons generated at this time hardly reach the detector, the signal intensity at the bottom edge is decreased, and a profile 54 of the bottom edge as indicated by a dotted line in FIG. 4 (*b*) is obtained. Therefore, a large signal difference is generated between the profile of the bottom edge obtained by beam scanning with the focus set on the bottom portion 31 and the profile of the bottom edge obtained by beam scanning with the focus set on the upper portion 32 of the sample. In the present embodiment, in order to quantitatively evaluate the signal difference between two profiles, the area between two waveforms is obtained by using, for example, integration.

Next, when a graph in which a vertical axis represents the signal difference in the profiles of the bottom edge and a horizontal axis represents the taper angle of the pattern is created, a relationship as shown in FIG. 4(*c*) is obtained. As the taper angle of the pattern increases, the signal difference in the bottom edge decreases, and when the taper angle reaches or exceeds a certain degree, the signal difference in the bottom edge asymptotically approaches a constant value, which does not depend on the change in the taper angle. Using this relationship, the aperture angle is calculated, for example, as follows. First, a straight line 56 is obtained by approximation using several points in a region where the taper angle is sufficiently large. Next, a straight line 57 is obtained by linear approximation using several points in a region where the taper angle is small. A taper angle 58 at an intersection of the two obtained straight lines can be defined as the aperture angle.

Here, the feature amount for measuring the aperture angle is not limited to the area surrounded by the two bottom profiles, and may be a difference from reference signal intensity. For example, the feature amount can also be calculated as a difference between signal intensity at a coordinate point having minimum signal intensity in the profile of the bottom edge obtained when the focus is set on the upper portion of the sample and signal intensity of the same coordinate point in the profile of the bottom edge obtained when the focus is set on the bottom portion of the sample. In this case, when the vertical axis represents the feature amount and the horizontal axis represents the taper angle, a graph similar to FIG. 4(*c*) is drawn. In definition of any feature amount, the aperture angle is calculated by using a property that the feature amount asymptotically approaches a certain constant value with respect to the change in the taper angle.

In addition to the above method, other methods for comparing a plurality of feature amounts obtained by beam scanning with different focus conditions may be applied, as long as a signal amount difference at the time of beam scanning of the bottom edge under different focus conditions may be specified. In addition, other feature amounts that can evaluate the shape of the signal waveform (first signal waveform) obtained when the focused is set on the bottom portion of the pattern can also be applied to the bottom edge.

Since signal differences 52 and 55 may relatively increase or decrease due to the influence of roughness, rounding, or the like on a tapered upper portion of an actual sample, an offset may be given to the taper angle at the intersection in consideration of the increase or decrease, so as to determine the aperture angle. In this case, for example, a table or the like showing a relationship between a roughness evaluation value or the like and an offset amount is created in advance, the roughness evaluation value is obtained based on SEM image acquisition, and then the offset amount is obtained with reference to the table.

After the aperture angle is measured as described above, the aperture angle is adjusted. Here, a method for adjusting a beam aperture angle based on a length measurement value according to an SEM image is proposed. FIG. 5 is a flowchart showing steps of adjusting the aperture angle. The control unit 12 moves the stage 6 and moves the sample 7 to the irradiation position of the beam (step 200). The sample 7 is, for example, a semiconductor sample on which a line pattern or a hole pattern is formed.

After the irradiation position (field of view) of the beam is located on a target pattern, the beam is focused on the bottom portion of the pattern (step 201), and beam scanning is performed. Next, signals such as secondary electrons obtained by beam scanning are detected, and a profile (line profile) is generated based on the signals (step 202). For example, in a case of a deep groove pattern, the generated line profile is a signal waveform having peaks at positions corresponding to one side wall and the other side wall respectively. In such a signal waveform, the signal intensities of the peaks are defined as 100% and the signal intensity of a baseline is defined as 0%. For example, a plurality of threshold values are set in a unit of 10%, and the width (length measurement value) of the deep groove is measured by a threshold method (step 203).

As the beam aperture angle changes, a prospective angle of the beam with respect to a three-dimensional structure (relative angle between the side wall of the pattern and the beam) changes, causing the line profile at the edge portion to be changed. The larger the aperture angle is, the more likely it is to be influenced by a three-dimensional barrier, resulting that the profile loosens and the length measurement value changes. When the profile loosens, the length measurement value of the line width is reduced if the threshold values are set on a top side and is increased if the threshold values are set on a bottom side.

Figure 6A:
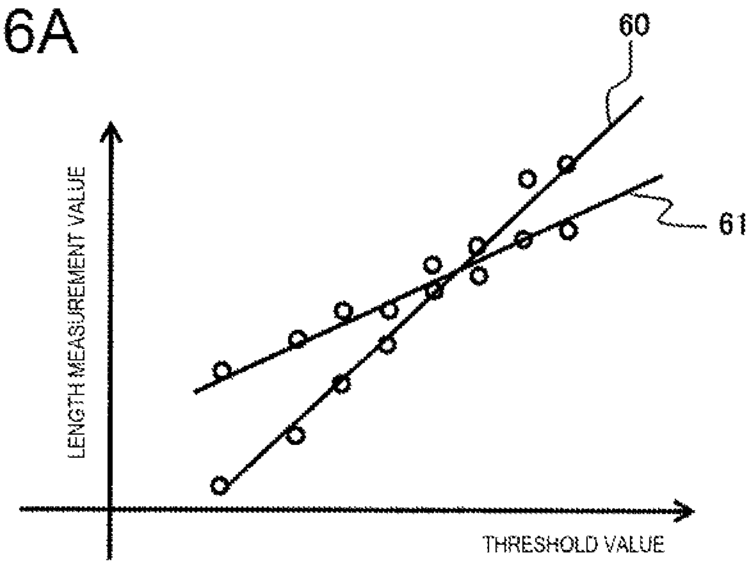
FIGS. 6A and 6B show graphs showing a change in a length measurement value obtained by setting a plurality of threshold values for the profile waveform.
Figure 6B:
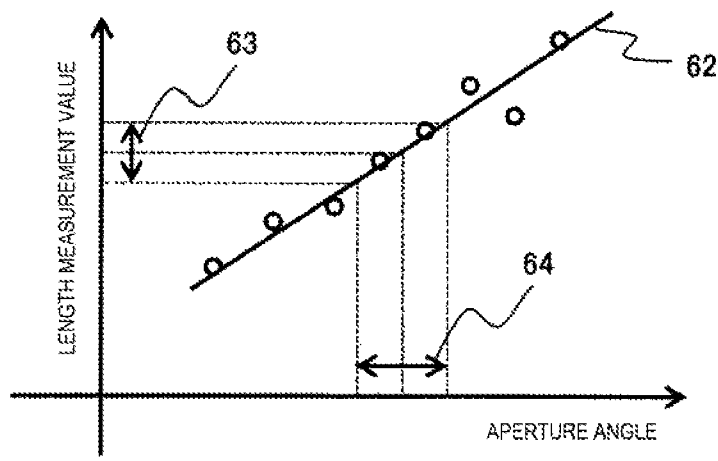

By utilizing a change in the length measurement value with respect to the change in the threshold value, the aperture angles between the devices are compared, and the adjustment is performed so as to make them coincide with each other. For example, the aperture angles are compared based on the length measurement value and the aperture angles are adjusted so as to reduce the machine difference between the devices. As shown in FIG. 6(*a*), a pattern of a reference sample is measured by a certain device A and a relationship 60 between the threshold value and the length measurement value is obtained. Next, the same pattern is measured by another device B, and a relationship 61 between the threshold value and the length measurement value is obtained in a similar manner.

The machine difference in the aperture angles is determined based on an inclination of the change in the length measurement value with respect to the threshold value (step 204). When the aperture angle of the device B is aligned with that of the device A, it can be determined that the aperture angle is small if the inclination of the relationship line obtained by the device B is smaller than that obtained by the device A as shown in FIG. 6(*a*).

Therefore, the device may be adjusted so as to increase the aperture angle of the device B (step 205). Although a method for performing comparison for two devices has been described here, the invention is not limited thereto and the comparison can be performed for a plurality of devices. In this case, there is a method in which some device is used as a reference device, and the other devices are adjusted to the reference device. Instead, based on an average value of a plurality of devices, each device may be adjusted to the average value. The processor incorporated in the calculation unit 14 executes a program stored in a storage medium (not shown) to linearly approximate the length measurement value that changes according to the change in the threshold values, for a plurality of devices. The inclination of the approximate curve is obtained to obtain the inclination of each device. The beam aperture angle may be adjusted so as to make the inclinations of the plurality of devices coincide with each other. When the aperture angle of the device B is adjusted to coincide with the aperture angle of the device A, a sample evaluated by the device A or a sample deemed the same is introduced into the device B, and in the device B, the lens condition is adjusted so as to make the aperture angle of the device B close to the aperture angle of the device A. In this case, the aperture angle adjustment and the inclination evaluation may be repeated to gradually make the aperture angle of the device B close to the aperture angle of the device A. Alternatively, it is also possible to prepare a table indicating a relationship between the difference in the inclinations and the lens adjustment amount. Then, a lens condition is read by referring the difference in the inclination to the table, such that the aperture angle may be adjusted. Further, the lens condition of the device B whose inclination coincides with that of the device A may be obtained by obtaining the inclinations at two or more aperture angles and performing regression analysis with the inclination as an explanatory variable and the lens condition as an objective variable.

The aperture angle of the charged particle beam device can be adjusted by changing the intensity of a plurality of lenses controlling the beam. It is necessary to set the focus on the sample surface in the SEM, and the focus can be set by changing an intermediate crossover height 11 as shown in FIG. 1 at this time. As the crossover height 11 is changed to set the focus on the sample surface, the beam aperture angle directly above the sample changes. At this time, the crossover height 11 can be controlled by adjusting the excitation current of the focusing lens 3. Therefore, for example, if a correlation between the excitation current and the length measurement value is acquired and recorded, it is possible to create a calibration curve 62 as shown in FIG. 6(*b*). A calibration curve is created in advance for each threshold value, and an excitation current amount required for the adjustment can be calculated based on a deviation amount of the length measurement value and the calibration curve.

It is also possible that the calibration curve 62 is created in advance, and the aperture angle is adjusted with reference to the calibration curve. For example, a predetermined range 63 may be provided for the length measurement value, and a corresponding aperture angle range 64 may be set in advance.

On the assumption as described above, with respect to each device, when the obtained length measurement value falls within the predetermined range of the length measurement value, it is determined that the aperture angle also falls within the predetermined range. Otherwise, the excitation intensity of the focusing lens is changed, the aperture angle is adjusted, and it is determined that the aperture angle adjustment is completed if the length measurement value falls within the predetermined range.

The methods for adjusting the aperture angle are not limited to the above. For example, a voltage applied to the sample 7 or a voltage applied to an acceleration lens 10 may be changed. Further, a distance between the objective lens 10 and the sample 7 may also be changed.

The larger the aperture angle is, the higher the image resolution is, and therefore, from the viewpoint of higher resolution, it is desirable to set the aperture angle as large as possible. Meanwhile, when the aperture angle is equal to or larger than the taper angle of the pattern, the beam interferes with the pattern at the time of scanning the bottom edge and the profile loosens, as described above. That is, in order to obtain both high resolution and an appropriate profile waveform, it is desirable to select the largest aperture angle within an aperture angle range in which the beam does not interfere with the pattern at the time of scanning the bottom edge.

Therefore, an appropriate aperture angle is set according to a flowchart shown in FIG. 11. FIG. 11 is a flowchart showing steps of setting an aperture angle suitable for measuring a target pattern based on the profile waveforms obtained by setting a plurality of aperture angles. As shown in FIG. 11, a sample having a pattern such as a deep groove is introduced into the SEM, and a field of view is moved so as to include the pattern to be measured in the field of view by controlling the stage 6 and a deflector for moving the field of view (step 1101). Next, the lens condition is adjusted so as to set the focus on a bottom portion of the deep groove at a predetermined aperture angle (step 1102). When the lens condition adjusted in step 1102 is maintained, a first profile waveform including a bottom edge is generated by beam scanning a region including the deep groove (step 1103).

Next, the lens condition is adjusted (step 1104) so as to set the focus on a sample surface (step 1104), and under this lens condition, a second profile waveform is generated by beam scanning a region including the bottom edge (step 1104). After the first profile waveform and the second profile waveform are acquired, a feature amount is calculated for the waveforms corresponding to the bottom edge by using, for example, the method shown in FIGS. 4(*a*) and 4(*b*) (step 1105). The processing in steps 1102 to 1106 is repeated a plurality of times under different lens condition (aperture angle) settings and a graph showing a relationship between the lens condition and the signal difference in the bottom edge as shown in FIG. 12 is plotted.

When the bottom edge is irradiated with the beam in a state of “the beam aperture angle<the taper angle of the side wall of the pattern”, a luminance signal corresponding to an amount of electrons emitted from the bottom edge is obtained. Meanwhile, when the bottom edge is irradiated with the beam in a state of “the beam aperture angle>the taper angle of the side wall of the pattern”, a part of the beam interferes with the sample surface or the side wall of the deep groove, causing the amount of electrons emitted from the sample to be increased by an interference amount. Meanwhile, when the bottom edge portion is irradiated with the beam with the focus set on the sample surface, the signal amount changes slightly depending on the aperture angle, but a change in the signal amount between different aperture angles is smaller than a case where the beam irradiation is performed with the focus set on the bottom portion.

On the assumption as described above, when difference calculation results of a plurality of different lens conditions (aperture angles) are plotted in the graph as shown in FIG. 12, in the region of “the beam aperture angle<the taper angle of the side wall of the pattern”, there is no significant change in the difference calculation results even when the aperture angles are changed, but in the region of “the beam aperture angle>the taper angle of the side wall of the pattern”, the difference calculation results are larger than those of the region of “the beam aperture angle<the taper angle of the side wall of the pattern”, and the difference calculation results change greatly as the aperture angles change. Therefore, as shown in FIG. 12, points in the two regions are linearly approximated, an approximation straight line 1201 (“beam aperture angle<the taper angle of the side wall of the pattern”) and an approximate straight line 1202 (the beam aperture angle>the taper angle of the side wall of the pattern”) are generated, and it is possible to find a lens condition that “the beam opening angle is approximately equal to the taper angle of the side wall of the pattern” by obtaining a lens condition 1203 corresponding to an intersection of the two straight lines (step 1107).

By setting the lens condition (step 1108), it is possible to generate an image with high resolution while reducing sagging of the peak of the profile waveform. In order to avoid the interference between the beam and the side wall, a lens condition may be set such that the aperture angle is narrower than the aperture angle in the lens condition obtained as described above (for example, in order to reduce the crossover height 11 by a predetermined amount, the excitation current of the focusing lens 3 is weakened by a predetermined amount).

According to the charged particle beam device operated by the operation program as shown in FIG. 11, it is possible to set a lens condition that is an optimum aperture angle for an actual pattern to be measured. Further, when the beam aperture angle required for measurement is determined, for example, an aperture calibration sample having a taper angle same as the beam aperture angle may be prepared in advance, and the aperture angle may be adjusted using the calibration sample before the measurement.

Embodiment 2

FIG. 7 is a flowchart showing steps of measuring a beam aperture angle by tilting the beam. The control unit 12 moves the stage 6 and moves the sample 7 to an irradiation position (field of view) of the beam (step 300).

Figure 8A:
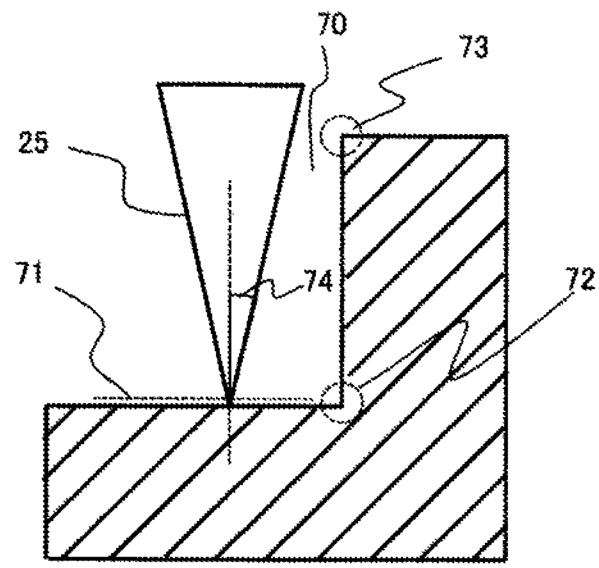
FIGS. 8A and 8B show sectional views of a sample used for aperture angle measurement.
Figure 8B:
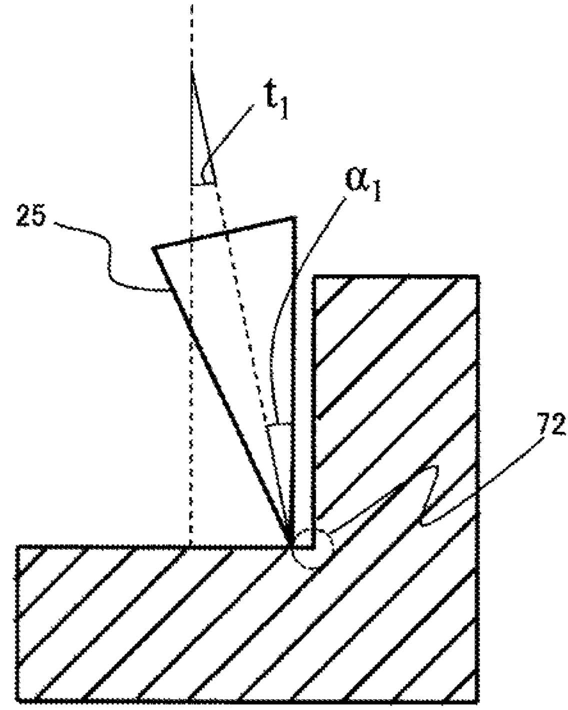

In the sample 7, a pattern 70 having a taper angle of 0 degree or a known shape is formed as indicated by a shaded portion in FIG. 8(*a*). Next, an incident angle of the beam with respect to an ideal optical axis of the beam is set by using a deflector inside the microscope or an alignment device for beam adjustment (step 301). Here, an example in which a beam tilt angle is set to 0 degree (an angle same as that of the ideal optical axis of the beam) as shown in FIG. 8(*a*) is described.

First, the beam 25 is focused on a bottom portion 71 of the pattern 70 (step 302), an SEM image is acquired, and the image is analyzed to obtain a profile (step 303).

Next, a feature amount is extracted from the obtained profile (step 304). Here, attention is paid to a profile of a boundary (hereinafter, refer to as bottom edge 72) between the bottom portion 71 and a side wall of the pattern 70.

When a beam aperture angle 74 is larger than a taper angle of the pattern 70 and the beam 25 passes through the bottom edge 72 (when a focus of the beam 25 coincides with a position of the bottom edge 72), a part of the beam collides with an upper portion 73 of the structure of the sample. At this time, secondary electrons generated due to the edge effect are added to bottom edge signals. When the beam scanning is performed in this situation, the profile of the bottom edge rises with drawing a hem, as indicated by a solid line (beam profile 80) of a graph in FIG. 9(*a*). It is possible to estimate the aperture angle by discriminating the difference in drawing manners of the hem.

In the profile of the bottom edge, a straight line 81 having a flat inclination is obtained by linearly approximating signals at a flat portion before the signals rise. Next, a straight line 82 is obtained by performing linear approximation using, for example, several signals having a largest signal increase rate in the signals at a portion of the bottom profile that steeply rises. An area 83 of a shaded portion surrounded by the obtained two straight lines and the bottom profile 80 is defined as an area of the hem (feature amount).

Next, as shown in FIG. 8(*b*), a tilt angle of the beam 25 is changed (step 305). In order to perform beam tilting, a tilt deflector including, for example, a two-stage deflector can be used. For the beam tilting, first, the beam is deflected away from the ideal optical axis using an upper stage deflector, and then the beam is deflected by using a lower stage deflector so as to swing back the beam towards the ideal optical axis, thereby tilting the beam in a desired direction. Similarly for the tilted beam, the beam 25 is focused on the bottom portion 71, an SEM image is acquired, and a profile is obtained. The area of the hem is calculated based on the obtained profile.

As exemplarily shown in FIG. 8 (*b*), if a tilt angle $t_1$ of the beam satisfies "an aperture angle $\alpha_1$ of the beam−the taper angle of the side wall of the pattern" (in the example of FIG. 8(*b*), since the taper angle of the side wall of the pattern is 0 degree, "$t_1=\alpha_1$"), the beam 25 does not collide with the side wall of the pattern when the bottom edge 72 is scanned with the beam 25.

Figure 9A:
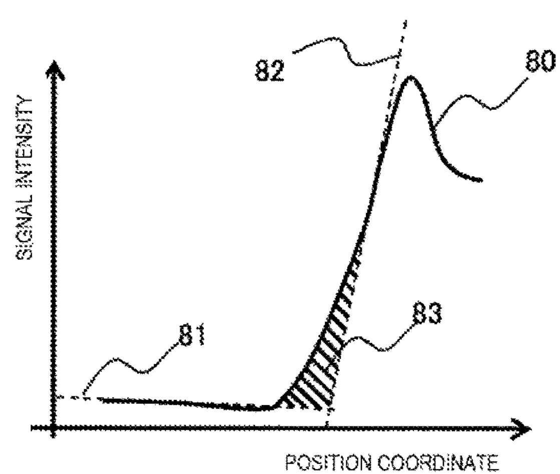
FIGS. 9A to 9C show diagrams showing bottom edge profile waveforms obtained by beam scanning at a plurality of tilt angles and a relationship between a tilt angle and a feature amount of the bottom edge waveform.
Figure 9B:
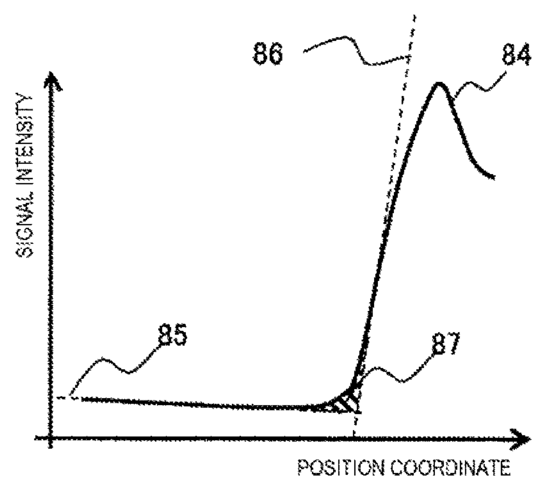
Figure 9C:
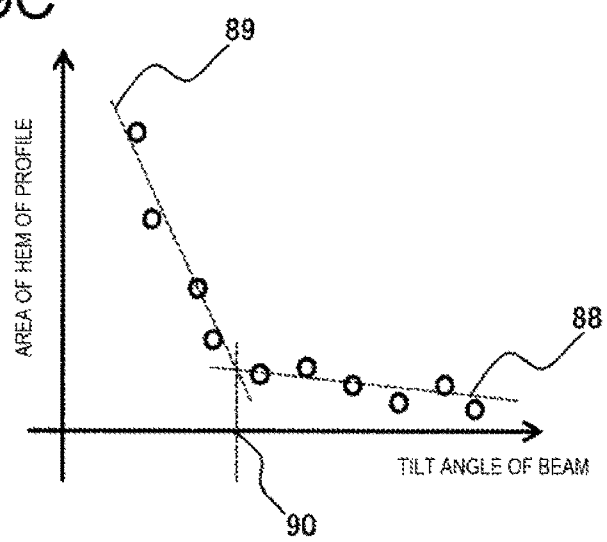

Therefore, the profile (bottom profile) obtained when the bottom edge is scanned with the beam at the tilt angle of $t_1$ ($>\alpha_1$), steeply rises without drawing a hem, as indicated by a solid line 84 of the graph of FIG. 9(*b*). Therefore, an area 87 of the hem is reduced, which is surrounded by a straight line 85 obtained by linearly approximating signals at a flat portion of the bottom profile, a straight line 86 obtained by linear approximating signals at a portion of the bottom profile that steeply rises, and a bottom profile 84.

After calculating the area of the hem of the bottom profile at a predetermined beam tilt angle, the aperture angle is calculated by the following method (step 306). When a graph in which the horizontal axis represents the tilt angle and the vertical axis represents the area of the hem is drawn, a relationship as shown in FIG. 9(*c*) is obtained. As the tilt angle increases, the area of the hem decreases, and when the tilt angle reaches or exceeds a certain degree, the area of the hem asymptotically approaches a value, which does not depend on the change in the tilt angle. The aperture angle is calculated, for example, as follows, using the relationship. First, several points in a region where the tilt angle is large are linearly approximated to obtain a straight line such as a dotted line 88. Next, several points in a region where the taper angle is small are linearly approximated to obtain a straight line such as a dotted line 89. A tilt angle at an intersection 90 of the two obtained straight lines is obtained as the aperture angle. Since signal differences 83 and 87 may relatively increase or decrease due to the influence of the roughness, rounding, or the like of a tapered upper portion of an actual sample, an offset may be given to the tilt angle at the intersection to determine the aperture angle. The tilt angle is stored in a predetermined storage medium in advance, and is in association with deflection signals such as an excitation current, an applied voltage, or a DAC value to be supplied to the deflector, and a processor calculates the beam aperture angle based on the tilt angle stored in the storage medium. After measuring the aperture angle, the aperture angle is adjusted in a similar manner as Embodiment 1.

REFERENCE SIGN LIST

1 vacuum chamber
2 charged particle source
3 focusing lens
4 deflector
5 objective lens
6 stage
7 sample
8 detector
9 signal electron
10 acceleration electrode

11 crossover height
12 control unit
13 image processing unit
14 calculation unit
20 deep groove
21 bottom portion of sample
22 upper portion of sample
23 taper angle
24 bottom edge
25 beam
30 pattern
31 bottom portion of sample
32 upper portion of sample
33 taper angle
34 bottom edge
50 bottom profile
51 bottom profile
52 signal difference between two profiles
53 beam profile
54 beam profile
55 signal difference between two profiles
56 approximate straight line
57 approximate straight line
58 intersection of straight lines
60 approximate straight line
61 approximate straight line
62 approximate straight line
63 length measurement value range
64 aperture angle range
70 pattern
71 bottom portion of sample
72 bottom edge
73 top edge
74 beam aperture angle
80 beam profile
81 approximate straight line
82 approximate straight line
83 area of hem
84 beam profile
85 approximate straight line
86 approximate straight line
87 approximate straight line
88 approximate straight line
89 approximate straight line
90 intersection of straight lines

The invention claimed is:

1. A beam aperture angle adjusting method for adjusting a beam aperture angle of a charged particle beam device, the method comprising:

measuring a dimension of a pattern using a first charged particle beam device and outputting a first dimension value, based on a first signal generated by the first charged particle beam;

introducing a sample on which the pattern is formed into a second charged particle beam device;

measuring a dimension of the pattern using the second charged particle beam device and outputting a second dimension value, based on a second signal generated by the second charged particle beam;

determining the beam aperture angle based on a relationship between a taper angle of the pattern and a signal intensity of the first and second signals; and adjusting the beam aperture angle by adjusting, in combination, a focusing lens and an objective lens of the second charged particle beam device so as to make the second dimension value same as the first dimension value or within a predetermined range with reference to the first dimension value.

2. A charged particle beam device, comprising:

a plurality of lenses configured to converge a beam emitted from a charged particle source, the plurality of lenses including at least a focusing lens;

a control device configured to control the plurality of lenses so as to set a focus at a predetermined height of a sample and adjust a beam aperture angle;

a detector configured to detect a particle generated by irradiating the sample with a charged particle beam; and a processor configured to process output signals of the detector, wherein the processor measures a dimension of a pattern formed on the sample based on a first detection signal obtained by beam scanning of the pattern formed on the sample, measures the dimension of the pattern based on a second detection signal, and determines the beam aperture angle based on a relationship between a taper angle of the pattern and a signal intensity of the first and second detection signals, and the control device controls the beam aperture angle by adjusting the plurality of lenses so as to make the dimension value become a predetermined value.

3. The method according to claim 1, wherein a focusing point is fixed at a certain height by controlling the objective lens, and the beam aperture angle is changed by controlling the focusing lens.

4. The method according to claim 1, wherein the pattern is a hole or a groove.

5. The device according to claim 2, wherein the pattern is a hole or a groove.

* * * * *